United States Patent
Kishimoto et al.

[11] Patent Number: 6,093,637
[45] Date of Patent: Jul. 25, 2000

[54] METHOD OF MAKING A MULTI-LAYER INTERCONNECTION STRUCTURE

[75] Inventors: Koji Kishimoto; Yoshiaki Yamada, both of Tokyo, Japan

[73] Assignee: NEC Corporation, Tokyo, Japan

[21] Appl. No.: 08/946,786

[22] Filed: Oct. 8, 1997

Related U.S. Application Data

[62] Division of application No. 08/773,256, Dec. 23, 1996.

[30] Foreign Application Priority Data

Dec. 27, 1995 [JP] Japan .................... 7-341646

[51] Int. Cl.$^7$ .............................. H01L 21/4763
[52] U.S. Cl. .................... 438/624; 438/626; 438/631; 438/669; 438/763; 438/778; 438/787
[58] Field of Search .................... 438/624, 626, 438/631, 669, 778, 763, 787

[56] References Cited

U.S. PATENT DOCUMENTS

| | | | |
|---|---|---|---|
| 4,837,185 | 6/1989 | Yau et al. | 438/786 |
| 5,332,694 | 7/1994 | Suzuki | 438/624 |
| 5,563,105 | 10/1996 | Dobuzinsky et al. | 438/784 |
| 5,789,040 | 8/1998 | Martinu et al. | 427/575 |
| 5,883,001 | 3/1999 | Jin et al. | 438/624 |
| 5,953,635 | 9/1999 | Andidoh | 438/761 |

FOREIGN PATENT DOCUMENTS

| | | |
|---|---|---|
| 4-3932 | 1/1992 | Japan . |
| 5-206282 | 8/1993 | Japan . |
| 5-243402 | 9/1993 | Japan . |
| 6-69038 | 8/1994 | Japan . |
| 7-130847 | 5/1995 | Japan . |
| 7-288253 | 10/1995 | Japan . |

*Primary Examiner*—John F. Niebling
*Assistant Examiner*—Lynne A. Gurley
*Attorney, Agent, or Firm*—Young & Thompson

[57] ABSTRACT

A multi-layer interconnection structure in a semiconductor device has a interlevel dielectric layer of three $SiO_2$ films. The first $SiO_2$ film has a small thickness not lower than 25 nm and is formed by a dual-frequency plasma enhanced CVD process using alkoxysilane as a reactive gas. The second $SiO_2$ film has a large thickness ranging between 300 and 800 nm and is formed on the first $SiO_2$ film by an atmospheric pressure CVD process using a mixture of alkoxysilane and ozone as a reactive gas. The third $SiO_2$ film has a thickness of 50 nm and is flattened by an etch-back process of the same together with an overlying sacrificial spin-on glass film. A second layer interconnect pattern is formed on or above the flattened third $SiO_2$ film with an excellent reliability.

9 Claims, 8 Drawing Sheets

POWER DENSITY FOR LOWER FREQUENCY COMPONENT
(w/cm$^2$)

METHOD OF MAKING A MULTI-LAYER INTERCONNECTION STRUCTURE

This application is a division of copending application Ser. No. 08/773,256, filed Dec. 23, 1996.

BACKGROUND OF THE INVENTION a) Field of the Invention

The present invention relates to a semiconductor device of a multi-layer interconnection structure and a method for manufacturing the same, and in particular, to a structure of an interlevel dielectric layer formed between interconnect layers.

b) Description of the Related Art

With a miniaturization of semiconductor elements, it is essential to employ finer interconnect patterns in a semiconductor device of a multi-layer interconnection structure. To provide an interlayer insulating film for a semiconductor device which includes multilayer interconnect patterns, an insulating film made of silicon oxide which has a reduced dielectric constant and a stabilized quality is dominantly used for the purpose of reducing parasitic capacitances between upper (or overlying) interconnect layer and a lower (or underlying) interconnect layer as well as between interconnects in the same layer.

The width of interconnects and the spacing between the interconnects of a lower layer interconnect pattern is especially reduced with the miniaturization of the semiconductor devices. However, in order to avoid an increase in the interconnect resistance, it is necessary to secure a sufficient cross-sectional area for the interconnects. Accordingly, there results an increase in the aspect ratio of the interconnect itself (ratio of thickness to width of the interconnect) and an inter-interconnect aspect ratio (ratio of interconnect thickness to spacing between interconnects). In the latter respect, it will be necessary that an interlayer insulating film be provided to sufficiently fill the spaces between the underlying interconnects.

At the region where there is a significant physical step or level difference on the surface of the interlayer insulating film, insufficient focus margin will results in the photolithography and cannot therefore provide a fine resist pattern during the formation of a interconnect pattern in an overlying interconnect layer. Even after the fine resist pattern is formed, the significant step may cause a breakage in the overlying interconnects and also causes an etching residue of interconnect material to be left in the step region. Accordingly, it is required that the surface of the interlayer insulating film be smooth. Where the underlying interconnection is made of aluminum or an aluminum based alloy (referred to as simply aluminum hereinafter) in particular, a restriction is imposed on the interlayer insulating film that the insulating film be formed at a temperature which is 450° C. at most.

A technique of forming an interlayer insulating film in a fine multilayer interconnect structure made of aluminum is described, for example, in Japanese Patent Publication No. JP-B-1994-69038, which will be described below with reference to drawings as a first prior art.

FIGS. 1A to 1D show cross-sections of a semiconductor device described in the publication as mentioned above in consecutive steps of manufacturing the same. Referring first to FIG. 1A, formed on the main surface of a silicon substrate 101 is a thick insulating film 102, on which a first layer interconnect pattern made of aluminum and including interconnects 103a, 103b, 103c and 103d are formed.

Subsequently, a first interlayer insulating film 104 made of phospho-silicate glass (PSG) is deposited by a chemical vapor deposition (CVD) process so as to cover the first layer interconnects 103a, 103b, 103c and 103d and the thick insulating film 102. If the first layer interconnects are formed in a fine pattern and have a high aspect ratio, undesirable voids 105a and 105b will be formed in the insulating film, as shown in FIG. 1A.

Then, a liquid glass is spin-coated onto the first PSG film 104, and subjected to a heat treatment at a temperature of about 450° C. During the heat treatment, the liquid glass becomes solidified, forming a spin-on glass film 106 on the first PSG film 104 to form a structure shown in FIG. 1B.

Subsequently, the spin-on glass film 106 and a top portion of the first PSG film 104 are etched back by a dry etching process, as shown in FIG. 1C. The reactive gas used for the dry etching process contains a mixture of $CF_4$ and $O_2$. Since the voids 105a and 105b have been formed in the first PSG film 104, the first PSG film 104 is etched until these voids 105a and 105b are exposed during the etch-back step. As a result of the etch-back step, the first PSG film 104 which has exhibited a considerable degree of unevenness at the step of FIG. 1B is smoothed as shown in FIG. 1C.

A second PSG film 107 is then deposited on the smoothed first PSG film 104, as shown in FIG. 1D. In this manner, an interlevel dielectric layer including the first PSG film 104 and second PSG film 107 is formed on the first layer interconnects 103a, 103b, 103c and 103d.

Subsequently, a second layer interconnect pattern, which maybe made of aluminum, is formed on the interlevel dielectric layer, thereby achieving a two-layer interconnection structure.

Another example of a method for forming an interlevel dielectric layer in a fine multilayer interconnection structure is described in Japanese Patent Publication No. JP-A-1993-206,282, which will now be described as a second prior art.

FIGS. 2A to 2D are cross-sections of another semiconductor device in consecutive steps of the second prior art method as mentioned above. Referring to FIG. 2A, formed on a silicon substrate 201 is a thick insulating film 202 by a CVD process, on which a first layer interconnects 203a, 203b, 203c and 203d, which may be made of aluminum, are formed.

A first silicon oxide film is deposited on the first layer interconnects 203a, 203b, 203c and 203d and the thick insulating film 202 by using a plasma enhanced CVD (PECVD) process to provide a PECVD silicon oxide film 204, as shown in FIG. 2A. The first silicon oxide film 204 has a reduced thickness which is just sufficient to cover the surfaces of the first layer interconnects 203a, 203b, 203c and 203d.

A second silicon oxide film 205 is then formed, as shown in FIG. 2B, by an atmospheric pressure CVD process using as a reactive gas a mixture of TEOS (tetraethoxysilane: $Si(OC_2H_5)_4$) and $O_2$ gas containing $O_3$.

Subsequently, a liquid organic silica having a main constituent represented by $CH_3Si(OH)_3$ is applied by a spin-coating technique onto the second silicon oxide film 205, and subjected to a heat-treatment for an hour at a temperature of about 300° C. in a nitrogen atmosphere. In this manner, an organic silica film 206 is formed on the second silicon oxide film 205, as shown in FIG. 2C. Subsequently, the organic silica film 206 and a top portion of the second silicon oxide film 205 are etched back by a dry etching technique using $CF_4$ gas. The etch-back step completely removes the organic silica film 206 to flatten the second silicon oxide film 205.

Then follows a deposition of a third silicon oxide film, if necessary, on the flattened second silicon oxide film 205. It is to be noted that the third silicon oxide film is deposited by a PECVD process. An interlevel dielectric layer is thus formed. Subsequently, via-holes which reach the underlying first layer interconnects are formed in the interlevel dielectric layer, and a second layer interconnect pattern made of aluminum is then formed, thereby forming a two-layer interconnection structure.

The first prior art has a problem in that voids 105a and 105b are frequently formed in the insulating film at the spaces between the first layer interconnects, especially when the first PSG film 104 is thick, as shown in FIG. 1A. These voids remain in the interlevel dielectric layer even after the etch-back steps for flattening and the deposition of the second PSG film. Such a problem will be serious as the width of the first layer interconnects and the spacing therebetween are reduced to increase the inter-interconnect aspect ratio, which are generally accompanied by the miniaturization of the semiconductor elements.

Further, the PSG film 104 formed in the manner mentioned above has uneven surface to leave a residual metal of the overlying interconnect pattern after the etching thereof. This is because the PSG film in general has a poor step coverage, and, in particular, when the inter-interconnect aspect ratio is equal to or greater than unit and the spacing between interconnects is equal to or less than 1 micron ($\mu$m), the PSG film will not be deposited on the side-walls of the interconnects.

The second problem involved in the first prior art necessitates that the first PSG film 104 be deposited to a sufficient thickness even though voids in the insulating film may then be formed at spaces between the underlying interconnects as mentioned before. We analyzed the cause as follows: to assure a sufficient smoothness and flatness, it is desirable to select a ratio at unit or close to unit between the etch rate for the etch-back of the spin-on glass film 106 and the etch rate for the first PSG film 104. However, as a result of characteristics of the liquid glass during the spin-coating step, the spin-on glass film 106 is little formed on top of the isolated underlying interconnects, such as designated by numeral 103a. As a consequence, a portion of the first PSG film 104 overlying the isolated interconnect 103a is exposed during the initial phase of the etch-back step, and upon completion of the etch-back, the portion of the first PSG film is little left on the isolated interconnect 103a. For this reason, a sufficient thickness of the first PSG film 104 is required.

In addition, when the diameter of the via-hole is small, it will be necessary to remove the spin-on glass film 106 completely from the top surface of the interconnects by the etch-back step. This results from the following reason.

Specifically, if the spin-on glass film 106 is formed as an inorganic silica film, and if the inorganic silica film is exposed on the sidewall of the via-hole during the etching step for the via-hole, moisture will desorp from the inorganic silica film during the formation of the overlying interconnection layer, thereby raising the contact resistance between the overlying interconnects and the underlying interconnects. In particular, if the diameter of the via-hole is equal to or less than 1 $\mu$m, the problem of the increased contact resistance will be serious.

On the other hand, if the spin-on glass film 106 is formed as an organic silica film, it is necessary to provide an ashing treatment with an oxygen plasma in order to remove the photoresist after the etching step for the via-hole. However, the ashing treatment oxidizes the organic components in the organic silica film, making the spin-on glass film porous or reducing the spin-on glass film in the volume, whereby a desirable configuration of the via-hole will be lost to provide a barrel-shaped via-hole. For these reasons, it is necessary to grow the first PSG film 104 to a sufficient thickness.

In the second prior art, a first problem occurs when voids 207a and 207b are formed in the insulating film 205 at the spaces between underlying interconnects, as shown in FIG. 2B. These voids will be formed in a finer pattern wherein, for example, the spacing between the interconnects is equal to or less than 0.6 $\mu$m and the inter-interconnect aspect ratio is equal to or greater than unit.

Generally, the filling capability of the silicon oxide film formed by a CVD process using TEOS gas and $O_3$ gas to fill spaces between the interconnects is superior to a silicon oxide film deposited by another known technology. However, as the interconnect pat-tern becomes finer, voids are generated in the insulating film even in the technique as used herein.

A second problem involved in the second prior art is that, in the interlayer insulating film formed by the second prior art, the interlayer insulating film has an uneven surface, thereby increasing the possibility that the overlying interconnects may be broken or a residual metal of the overlying interconnects may remain after the etching thereof. This is because the coating capability of the liquid organic silica is not sufficient in case of coating on the second silicon oxide film 205 formed by a mixture of TEOS and $O_2$ gas containing $O_3$, providing a non-uniformity of the coat by repelling the liquid organic silica. This problem is also noted with an inorganic silica film.

SUMMARY OF THE INVENTION

It is therefore an object of the invention to provide a structure of an interlayer insulating film which can accommodate to a finer multi-layer interconnection structure and a method of manufacturing the same.

In accordance with a first aspect of the present invention, there is provided a semiconductor device of a multi-layer interconnection structure comprising a semiconductor substrate, an insulating film overlying the semiconductor substrate, a first interconnect pattern formed on the insulating film, a first silicon oxide film formed on the first interconnect pattern and the insulating film by a multiple-frequency plasma enhanced chemical vapor deposition (CVD) process using alkoxysilane as a reactive gas, a second silicon oxide film formed on the first silicon oxide film by an atmospheric pressure CVD process using a mixture of alkoxysilane and ozone as a reactive gas, and a second interconnect pattern overlying the second silicon oxide film, the first silicon oxide film having a thickness lower than a thickness of the first interconnect pattern.

In accordance with a second aspect of the present invention, there is provided a method for forming a semiconductor device of a multi-layer interconnection structure comprising the steps of forming an insulating film overlying a semiconductor substrate, forming a first interconnect pattern on the insulating film, forming a first silicon oxide film on the first interconnect pattern and the insulating film by a dual-frequency plasma enhanced chemical vapor deposition (CVD) using a higher frequency component and a lower frequency component for plasma discharge and using alkoxysilane as a reactive gas, the first silicon oxide film having a thickness lower than a thickness of the first interconnect pattern, forming a second silicon oxide film by an atmospheric pressure CVD process using a mixture of alkoxysilane and ozone as a reactive gas, and forming a second interconnect pattern overlying the second silicon oxide film.

In accordance with the semiconductor device of the present invention and manufactured by a method according to the present invention, the first silicon oxide film deposited on the surface of the underlying first interconnect pattern is deposited by a CVD process utilizing a plasma discharge in alkoxysilane, wherein the plasma discharge takes place using both a lower frequency power and a higher frequency power. The second silicon oxide film deposited by the atmospheric pressure CVD process using a mixture of alkoxysilane and ozone as a reactive gas on the first silicon oxide film exhibits an improved smooth surface. This effect is especially remarkable when the thickness of the first silicon oxide film is equal to or greater than 25 nm.

The effect by the invention is provided by the formation of a large number of alkyl radicals on the surface of the first silicon oxide film because the lower frequency power is added to the plasma discharge in the alkoxysilane. The presence of the alkyl radicals on the surface of the first silicon oxide film promotes a surface flow of intermediate products which are formed by a thermal reaction between the alkoxysilane and ozone during the atmospheric pressure CVD process by which the second silicon oxide film is formed.

The second silicon oxide film serves for filling the spaces between fine interconnects of the same layer. The thicker the second silicon oxide film, the more the filling capability and the flatness of the second silicon oxide film are improved. However, tensile stresses are produced in the second silicon oxide film and cracks may be developed in the same, when the film thickness exceeds 800 nm. From our experiments, it was found that the thickness of the second silicon oxide film should preferably be in the range from 300 nm to 800 nm.

A third silicon oxide film, deposited on the second oxide film, serves for further compensating unevenness of the second silicon oxide film caused by finer interconnects of the first layer interconnect pattern and smoothing the step regions caused by less finer interconnects. After the formation of a spin-on glass film and the etch-back step for the same and the third silicon oxide film, the spin-on glass film is removed from a region where the via-hole is formed.

In the manner as described above, the present invention facilitates the formation of a finer multi-layer interconnect structure, contributing to realization of a higher integrated semiconductor device of a higher operating rate.

The above and other objects, features and advantages of the present invention will be more apparent from the following description, referring to the accompanying drawings.

DESCRIPTION OF THE PREFERRED EMBODIMENTS

Figure 1A:
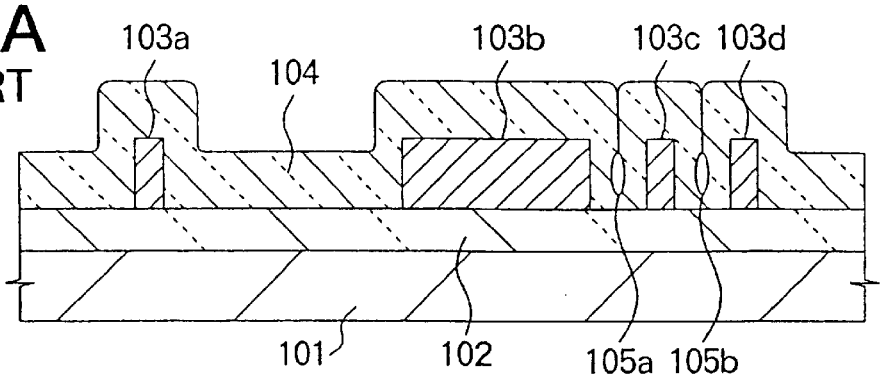
FIGS. 1A to 1D are cross-sectional views of a first conventional semiconductor device in consecutive steps of a process for manufacturing the same.
Figure 1B:
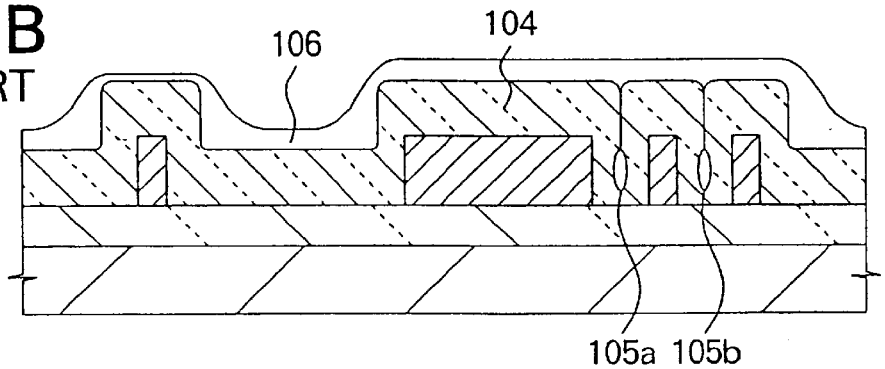
Figure 1C:
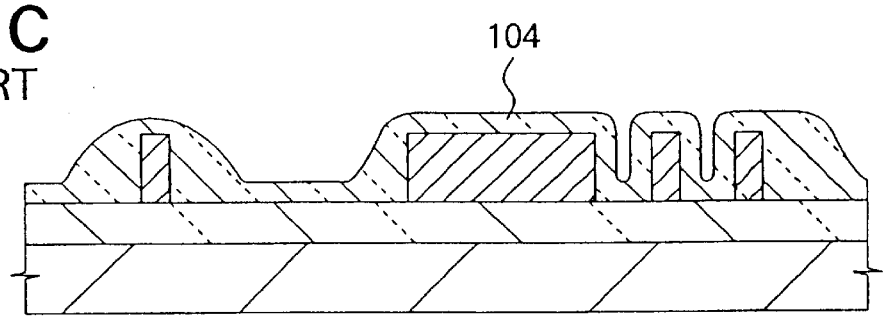
Figure 1D:
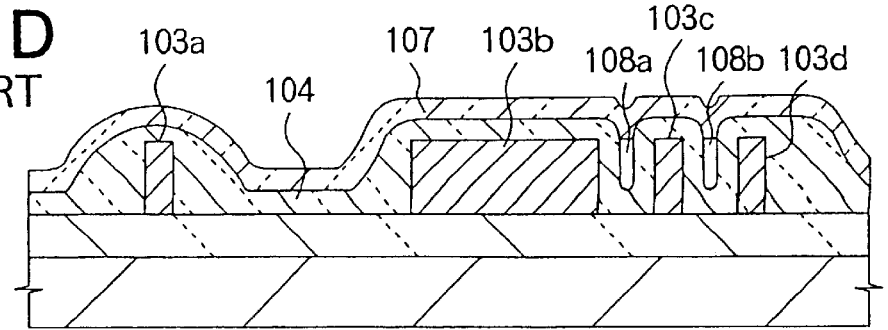
Figure 2A:
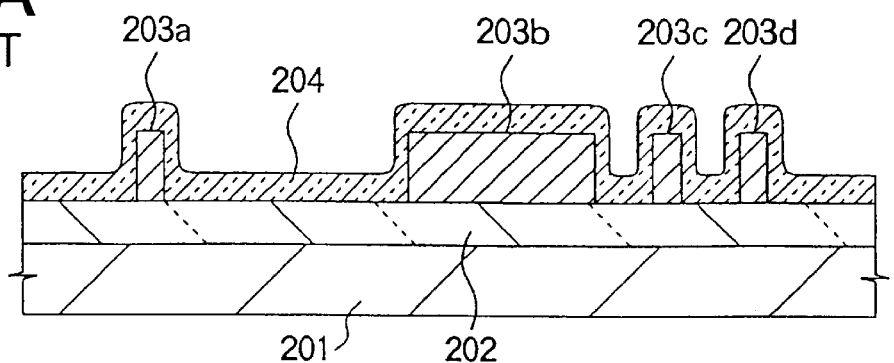
FIGS. 2A to 2D are cross-sectional views of a second conventional semiconductor device in consecutive steps of a process for manufacturing the same.
Figure 2B:
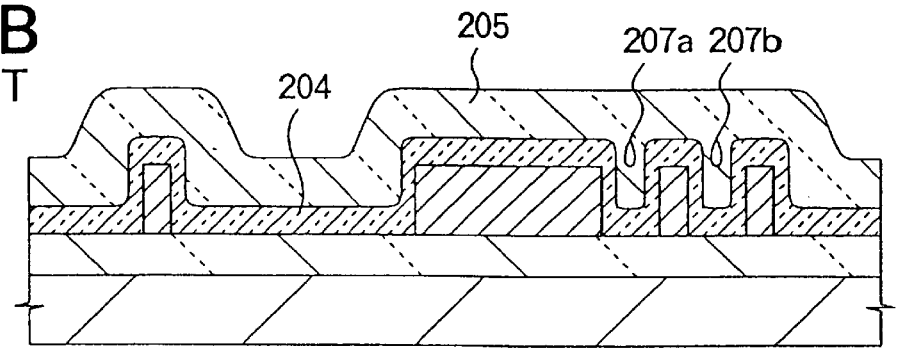
Figure 2C:
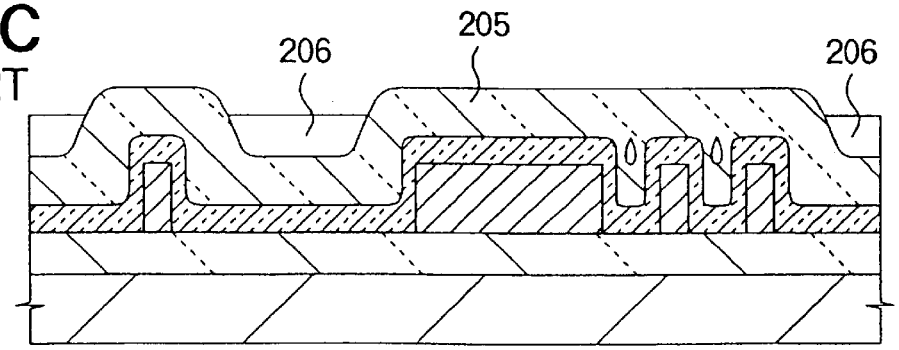
Figure 2D:
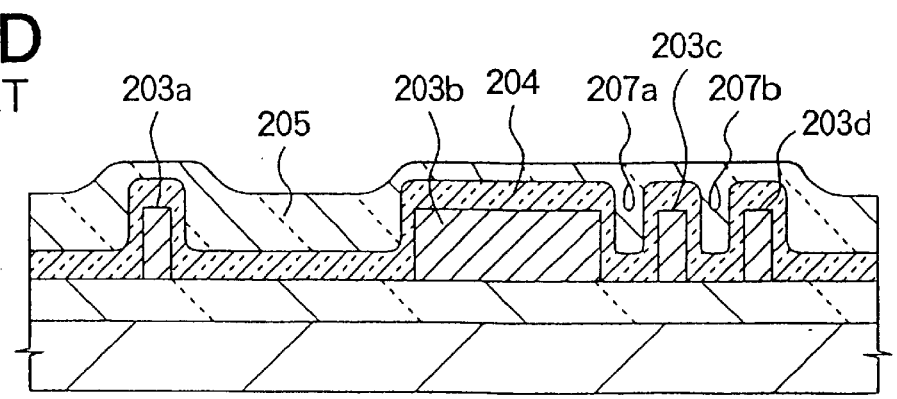
Figure 3:
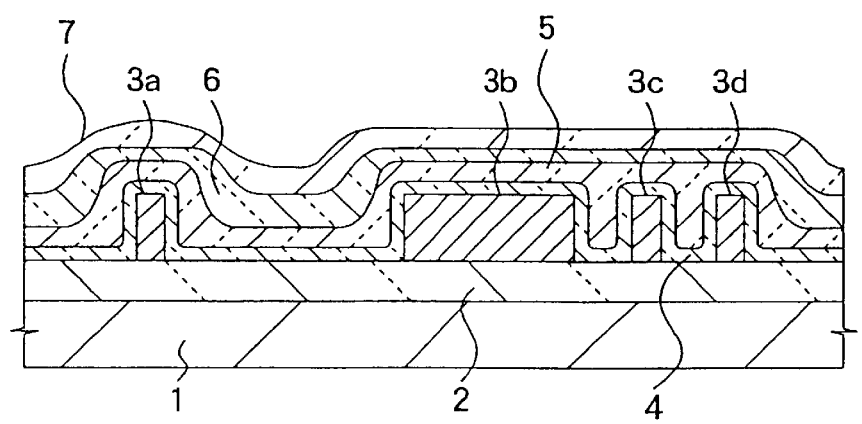
FIG. 3 is a cross-sectional view of a semiconductor device according to a first embodiment of the invention.

Now, preferred embodiments of the invention will be described with reference to the attached drawings. Referring to FIG. 3, there is shown a semiconductor device according to the first embodiment of the invention. Formed on the surface of a silicon substrate 1 is a thick insulating film 2, on which a first layer interconnect pattern including first layer interconnects 3a, 3b, 3c and 3d (abbreviated as 3a etc. hereinafter) are formed. A base insulating film 4 having a small thickness is formed to cover the surfaces of the first layer interconnects 3a etc. and exposed surface of the thick insulating film 2. The base insulating film 4 is referred to as a first silicon oxide film, which is deposited by a dual-frequency plasma enhanced CVD (referred to as DF-PECVD hereinafter) process. The DF-PECVD process uses a mixture of alkoxysilane gas such as TEOS and an oxidizing gas as a reactive gas.

A filling insulating film 5 is then formed to cover the base insulating film 4 and to fill the spaces between the first layer interconnects, including small spaces such as the spaces between interconnects 3b and 3c and between 3c and 3d. The filling insulating film 5 is referred to as a second silicon oxide film, which is deposited by a thermal CVD process using a mixture of TEOS and $O_3$ as a reactive gas, the process being referred to as a TEOS/ozone CVD process hereinafter.

The purpose of the base insulating film 4 formed by the DF-PECVD process is to improve the filling capability of the filling insulating film 5 formed by the TEOS/ozone CVD process.

A flattened insulating film 6 having a smoothed surface is formed on the filling insulating film 5. The flattened insulating film 6 is referred to as a third silicon oxide film and is flattened, by using an etch-back process for the entire surface of a spin-on glass film formed on the filling insulating film as a sacrificial film, to a degree which enables overlying interconnects to be formed substantially without any breakage therein. An overlying insulating film 7 or a top insulating film is then deposited so as to cover the flattened insulating film 6. Both the flattened insulating film 6 and the overlying insulating film 7 are deposited by an ordinary PECVD process.

In the first embodiment, the spin-on glass film is not left between the flattened insulating film 6 and the overlying insulating film 7. However, if via-holes are to be formed to reach only the first layer interconnects, the spin-on glass film may be left at the spaces between the first layer interconnects.

A method of manufacturing the semiconductor device of FIG. 3 will now be described hereinafter in detail.

Figure 4A:
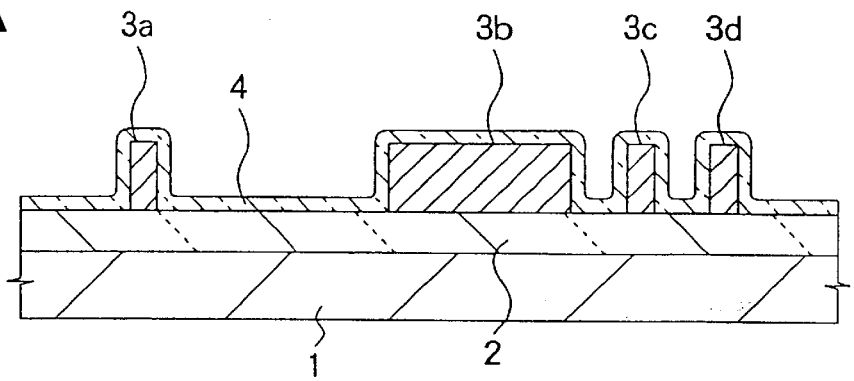
FIGS. 4A to 4F are cross-sectional views of the semiconductor device of FIG. 3 in consecutive steps of a process for manufacturing the same.
Figure 4B:
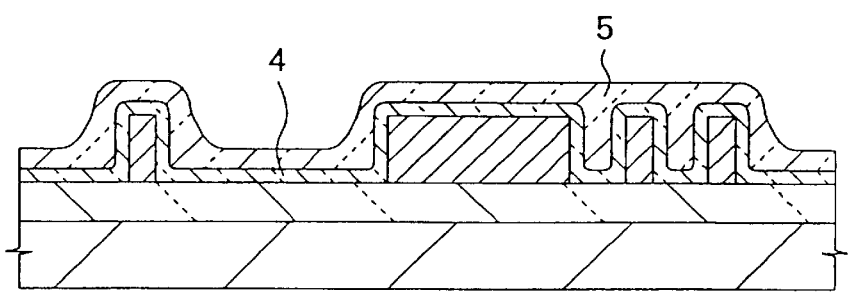

Referring to FIG. 4A, formed on the surface of a silicon substrate 1 is a thick insulating film 2 made of silicon oxide, on which a 700-nm thick metal laminate is formed including, for example, a titanium film, a titanium nitride film, an aluminum/silicon/copper alloy film and a titanium nitride film, which have thicknesses of 50 nm, 100 nm, 500 nm and 50 nm, respectively.

Subsequently, the metal laminate is subjected to patterning, using a photolithographic technique and a dry etching technique, to define first layer interconnects 3a etc. In this instance, the side-walls of the first layer interconnects are configured to stand vertically, or perpendicular to the surface of the underlying insulating film 2. A minimum space between the first layer interconnects is designed on the order of 0.5 µm, for example. In this instance, the aspect ratio of the interconnects and the inter-interconnect aspect ratio are on the order of 2.

Subsequently, a base insulating film 4 of a small thickness is deposited to cover the thick insulating film 2 and the surfaces of the first layer interconnects 3a etc. The base insulating film 4 is formed, by a DF-PECVD process using a mixture of TEOS and $O_2$ as a reactive gas, to a film thickness on the order of 100 nm. Since the side-walls of the interconnects stand vertically, the thickness of the base insulating film 4 at the location of the side-wall is on the order of 40 nm. It is necessary that the spaces between the first layer interconnects are not filled by the base insulating film 4.

The deposition of the base insulating film 4 by the DF-PECVD process is effected by a diode parallel plate plasma CVD system, for example, wherein dual frequencies including 250 kHz and 13.56 MHz components are used for generating an exciting discharge for plasma of the reactive gas. The substrate temperature and gas pressure are maintained at 350° C. and about 2 Torr, respectively.

Subsequently, a filling insulating film 5, referred to as a second silicon oxide film, is deposited on the base insulating film 4 to a thickness on the order of 400 nm. The filling insulating film 5 is deposited by a TEOS/ozone CVD process, using an atmospheric pressure CVD system, with an ozone concentration in oxygen gas being set at 130 g/m$^3$. The substrate temperature is selected at 400° C. The deposition of the second silicon oxide film by using the TEOS/ozone CVD process is effected under the conditions which provide a highest fluidity for the silicon oxide film and a best filling capability and flatness of the same.

Figure 4C:
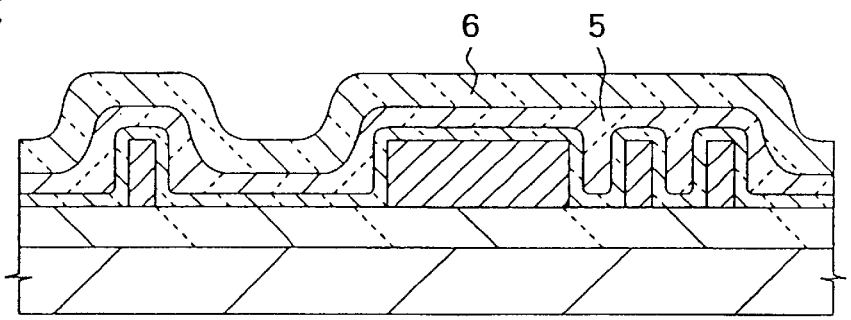
Figure 4D:
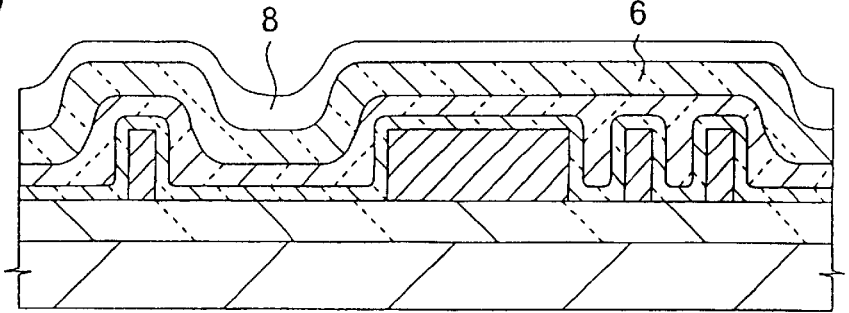

An insulating film 6, referred to as a third oxide film, is then deposited on the filling insulating film 5, as shown in FIG. 4C, by a PECVD process using a mixture of TEOS and $O_2$ as a reactive gas. The thickness of the third silicon oxide film 6 is about 800 nm. Subsequently, a liquid organic silica having a main constituent represented as $CH_3Si(OH)_3$ is applied by a spin-coating process on the insulating film 6, and a heat treatment is effected for an hour at a temperature of 300° C. and in a nitrogen atmosphere to form a spin-on glass film 8.

Figure 4E:
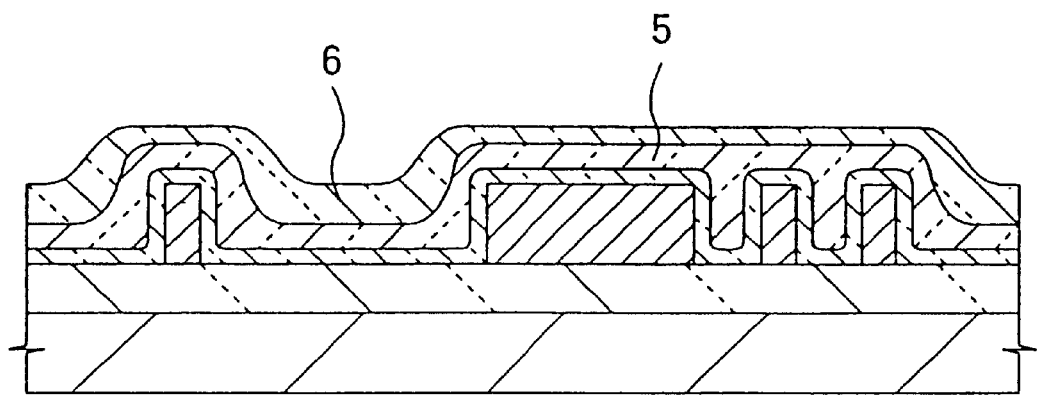

Subsequently, the entire spin-on glass film 8 and the top portion of the insulating film 6 are etched back by a dry etching technique using $C_2F_6$ plasma. It is preferable that the etch rate for the spin-on glass film 8 and the etch rate for the insulating film 6 be substantially equal to each other. While the liquid organic silica is used as a material to provide the spin-on glass film in the embodiment, a liquid inorganic silica having a main constituent represented as $Si(OH)_4$ may be used instead. In this case, the etch rate for the spin-on glass film may be greater than the etch rate for the insulating film 6, leading to a less flattened surface as compared to the case using the liquid organic silica. The etch-back step provides a smooth surface for the insulating film 6, as shown in FIG. 4E.

Figure 4F:
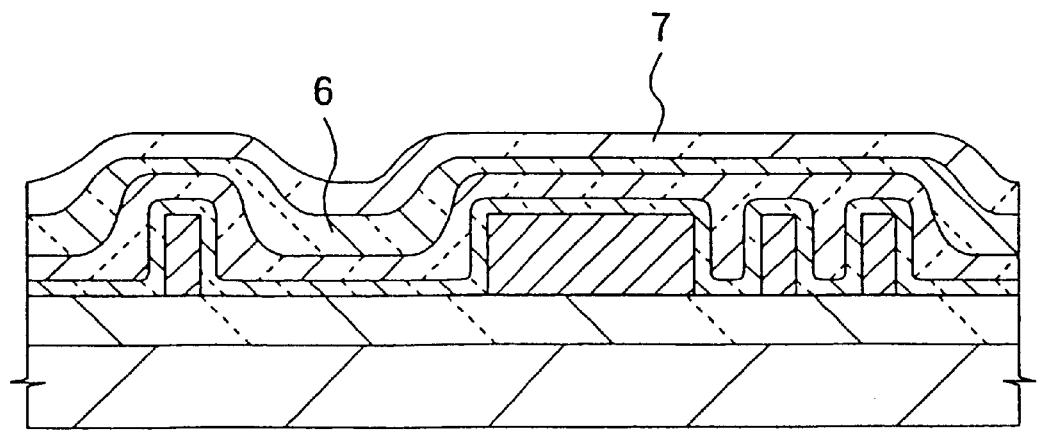

An overlying insulating film, referred to as a top insulating film 7, is then deposited on the flattened insulating film 6, as shown in FIG. 4F. The top insulating film 7 is deposited to a thickness of 200 nm by a PECVD process using a mixture of TEOS and $O_2$ as a reactive gas.

Subsequently, a heat treatment is effected at a temperature of 450° C. in a nitrogen atmosphere to form an interlevel dielectric layer shown in FIG. 3. Thereafter, a second layer interconnect pattern and via-holes reaching the first layer interconnects 3a etc. are provided to obtain the two-layer interconnection structure of the semiconductor device. The combination of the base insulating film 4 and the filling insulating film 5 is of importance in the present invention.

Various techniques have been examined in the present invention for depositing the base insulating film 4. The techniques included the use of a reactive gas such as a mixture of silane and nitrous oxide or a mixture of alkoxysilane and $O_2$, and the use of a single-frequency PECVD process or a dual-frequency PECVD process to provide an exciting discharge for a plasma of the reactive gas. As a result of the experiments, it was found that a dual-frequency PECVD process using an alkoxysilane based gas was remarkably effective. It was preferable that the dual-frequency PECVD process be implemented with the system and parameters indicated below:

Apparatus—diode parallel plate PECVD system;

Frequency for discharge—200 to 450 kHz as a lower frequency component, and 13.56 MHz as a higher frequency component;

Substrate temperature—300 to 450° C.; and

Reactive gas pressure—1 to 20 Torr.

It was also found that the TEOS/ozone CVD process used to form the filling insulating film 5 should preferably be implemented with the system and parameters as indicated below:

Apparatus: atmospheric pressure CVD system;

Substrate temperature: 350 to 450° C.;

$O_2$ gas flow rate: 5 to 8 standard liter per minute (SLM); and

Ozone concentration: 100 to 150 g/m$^3$.

Figure 5:
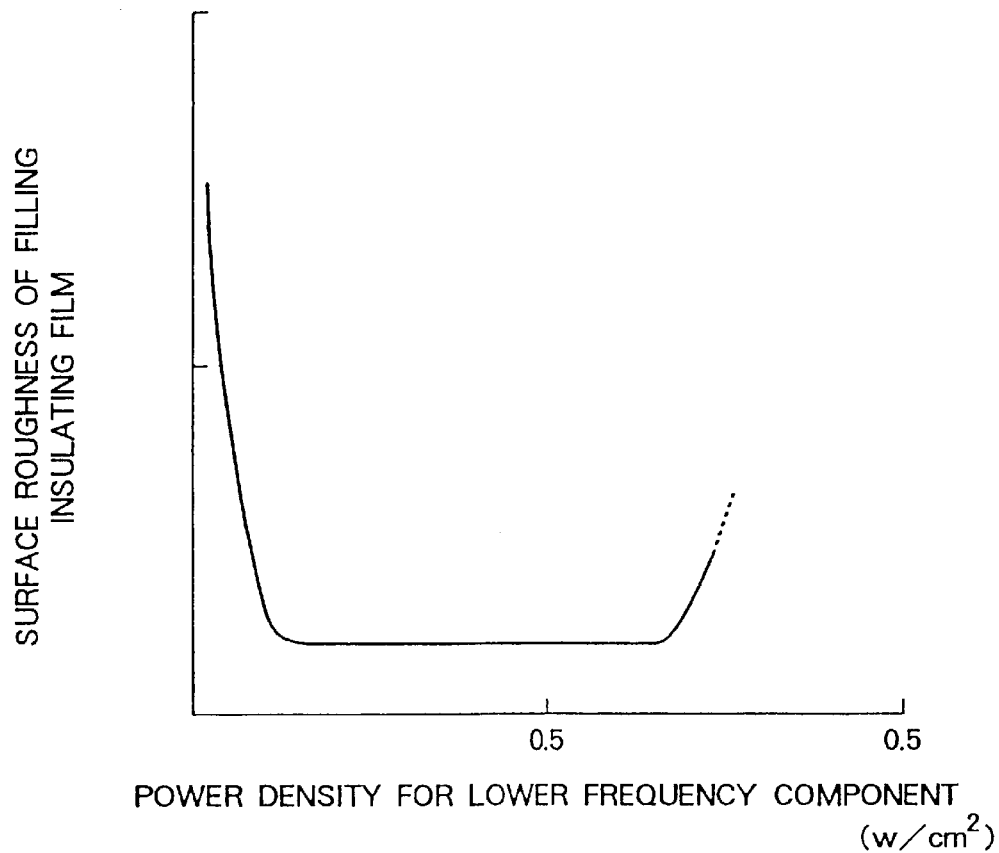
FIG. 5 is a graph for showing the surface roughness of filling insulating film as a function of power density for a lower frequency component during a dual-frequency plasma enhanced CVD process of the base insulating film.

It is to be noted that addition of the lower frequency component plays a significant role in the present invention during the formation of the base insulating film 4 by using the DF-PECVD process, as well as the control of the discharge power. FIG. 5 graphically illustrates a relationship between the surface roughness of the filling insulating film 5 and the power density for the lower frequency component for the DF-PECVD of the base insulating film 4, with the higher frequency component fixed at 0.6 watt/cm$^2$.

As will be understood from FIG. 5, the power density for the lower frequency component should preferably be in a range from 0.1 to 0.7 watt/cm$^2$. If the power density for the lower frequency component is below 0.1 watt/cm$^2$, the surface roughness of the filling insulating film 5 deposited on the base insulating film 4 increases. It is because the number of alkyl radicals which are incorporated into the base insulating film 4 is reduced accordingly. If the power density is above 0.7 watt/cm$^2$, a similar result will occur, because the surface configuration of the base insulating film 4 is degraded to enlarge the surface roughness of the filling insulating film 5. The less the surface roughness of the filling insulating film 5 formed on the base insulating film 4, the greater the effect of the invention will result.

In the first embodiment, the arrangement is such that the inter-interconnect aspect ratio in the first layer interconnects is on the order of 2, the width of the interconnects is 0.5 µm, and the side-walls of the interconnects stand vertically, i.e., extend perpendicular to the top surface thereof. With the present embodiment, a specific structure of the interlevel dielectric layer provides substantially no void in the insulating film and excellent smoothness, flatness and filling capability of the insulating film.

It should be noted that it is for example that the spin-on glass film 8 is entirely removed by the etch-back process in the first embodiment. If it is sufficient to form via-holes for the underlying interconnects, only portions of the spin-on glass film disposed on the underlying interconnects may be removed to leave the spin-on glass film at the spaces between the underlying interconnects.

Now a second embodiment of the invention will be described with reference to FIG. 6. Similarly to the first embodiment, a thick insulating film 12 is formed on a silicon substrate 11 and a first layer interconnects 13a, 13b, 13c, 13d and 13e (referred to as 13a etc., hereinafter) are formed on the insulating film 12. The first layer interconnects 13a etc. are formed to have tapered sides and exhibit a forward mesa configuration.

A thin base insulating film 14 covers the surfaces of the first layer interconnects 13a etc. and exposed surfaces of the thick insulating film 12. The base insulating film 14 is deposited by a DF-PECVD process which has been described in connection with the first embodiment.

A filling insulating film 15 further covers the base insulating film 14 and fills the spaces between the first layer interconnects, wherein the spacings between adjacent interconnects such as interconnects 13b and 13c, 13c and 13d, and 13d and 13e are small. The filling insulating film 15 is deposited by a TEOS/ozone CVD process.

The base insulating film 14-formed by the DF-PECVD process functions for removing the dependency of the overlying second silicon oxide film 15 formed by the TEOS/ozone CVD process upon the sensitivity to the underlying materials, to thereby improve the filling capability of the filling insulating film 15.

A flattened insulating film 16 having a smoothed surface further covers the filling insulating film 15. The flattened insulating film 16 is flattened especially in a region adjacent to the step regions formed by the underlying interconnects 13a etc., by using an etch-back process of a sacrificial spin-on glass film, the step regions being flattened to a degree so that overlying interconnects can be formed substantially without any breakage therein.

A process for manufacturing the semiconductor device shown in FIG. 6 will be described with reference to FIGS. 7A to 7E.

Figure 7A:
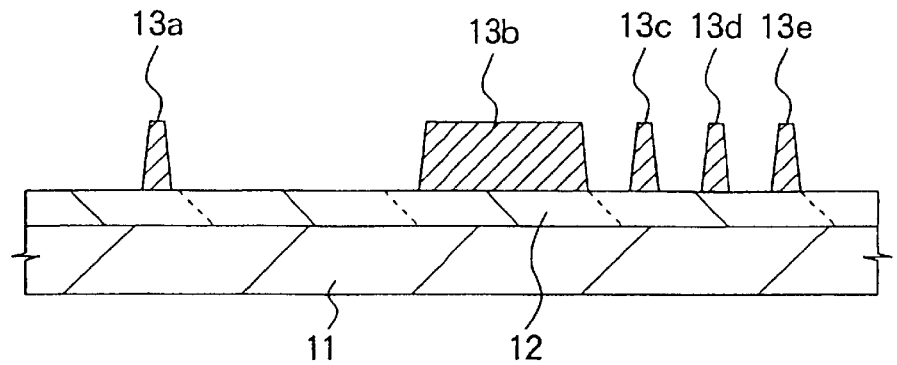
FIGS. 7A to 7E are cross-sectional views of the semiconductor device of FIG. 6 in consecutive steps of a process for manufacturing the same.

Referring first to FIG. 7A, a thick insulating film 12 made of silicon oxide, for example, is formed on a silicon substrate 11, and a first layer interconnect made of a metallic laminate is deposited on the thick insulating film 12. The metallic laminate includes, for example, a 50 nm-thick titanium film, a 100 nm-thick titanium nitride film, a 500 nm-thick aluminum/copper alloy film and a 50 nm-thick titanium nitride film, which are consecutively laminated to a total thickness of 700 nm.

Subsequently, a silicon oxide film is deposited to a thickness of about 200 nm on the TiN film of the first layer by a PECVD process. By using a photolithographic technique and a dry etching technique, the silicon oxide film is patterned to form an etching mask. A patterning for the first layer laminate is effected by using a dry etching technique with the etching mask to form a forward mesa configuration of the first layer interconnects 13a etc. The etching step is conducted to provide an inclination angle of 80 to 85° in the side-walls of each first layer interconnect with respect to the surface of the thick insulating film 12. The width of the interconnects and the spacing between adjacent interconnects are selected at about 0.25 µm, for example. In this instance, the aspect ratio of the first layer interconnects and the inter-interconnect aspect ratio will be on the order of 3.

Figure 7B:
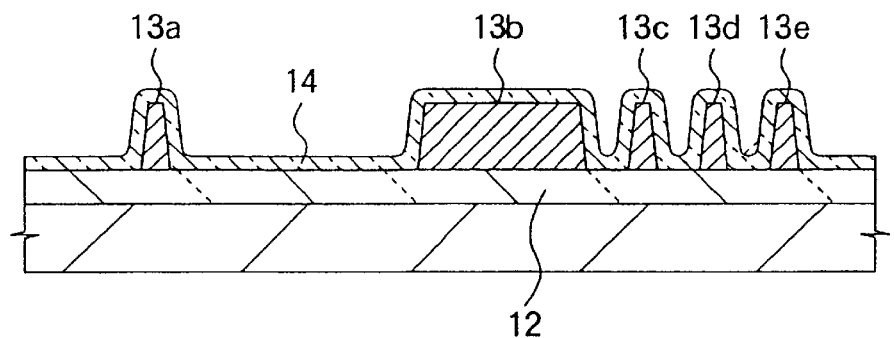

Thereafter, as shown in FIG. 7B, a base insulating film 14 of a small thickness is deposited, to cover the thick insulating film 12 and the first layer interconnects 13a etc., by a DF-PECVD process using a mixture of TEOS and $O_2$ as a reactive gas. The base insulating film 14 has a thickness of 30 to 50 nm.

The DF-PECVD process is effected under the conditions wherein dual frequency powers of, for example, 350 kHz and 13.56 MHz are simultaneously applied to generate a plasma. The substrate temperature and gas pressure are selected at about 400° C. and 1 Torr, respectively.

Figure 7C:
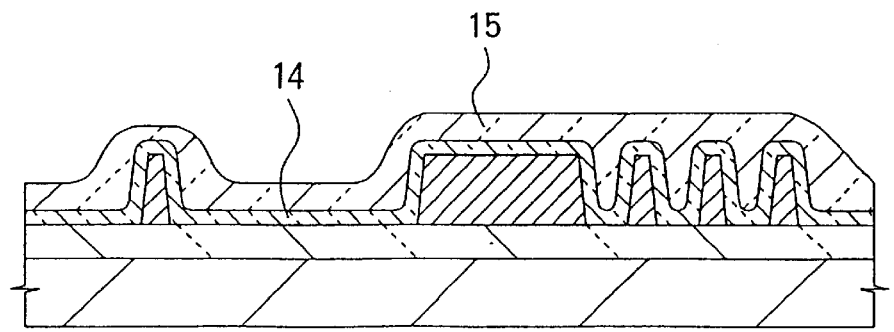

Subsequently, a filling insulating film 15 is deposited to a thickness of about 600 nm on the base insulating film 14, as shown in FIG. 7C, by a TEOS/ozone CVD process, which is conducted under the condition similar to that used in the first embodiment.

Figure 7D:
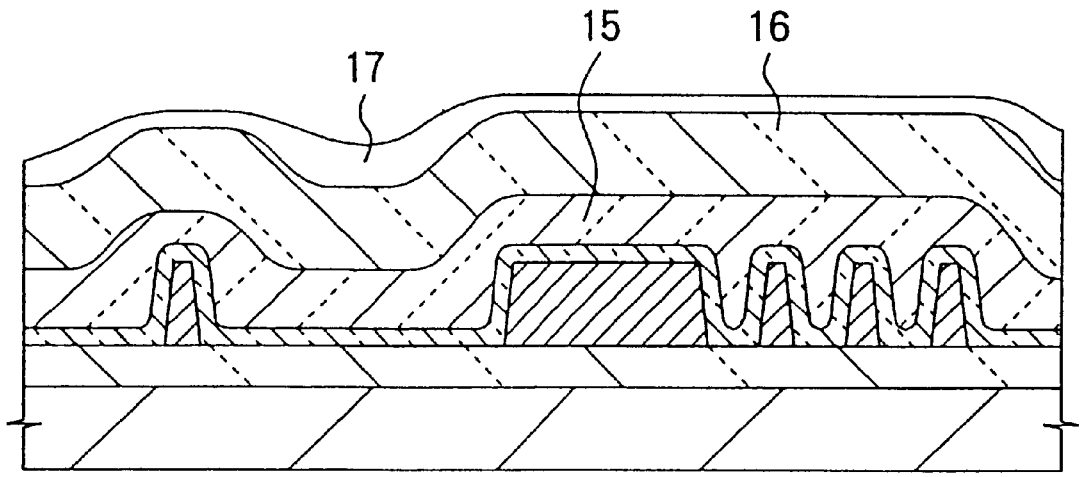

A third insulating film 16 is then deposited on the filling insulating film 15, as shown in FIG. 7D. The third insulating film 16 is made of silicon oxide film deposited by a PECVD process using a mixture of TEOS and $O_2$ as a reactive gas. The third insulating film 16 has a thickness of about 1.2 µm.

Subsequently, a liquid organic silica is spin-coated on the third insulating film 16, and a heat treatment is effected for an hour at a temperature of about 350° C. in a nitrogen atmosphere, thereby forming a spin-on glass film 17.

Figure 7E:
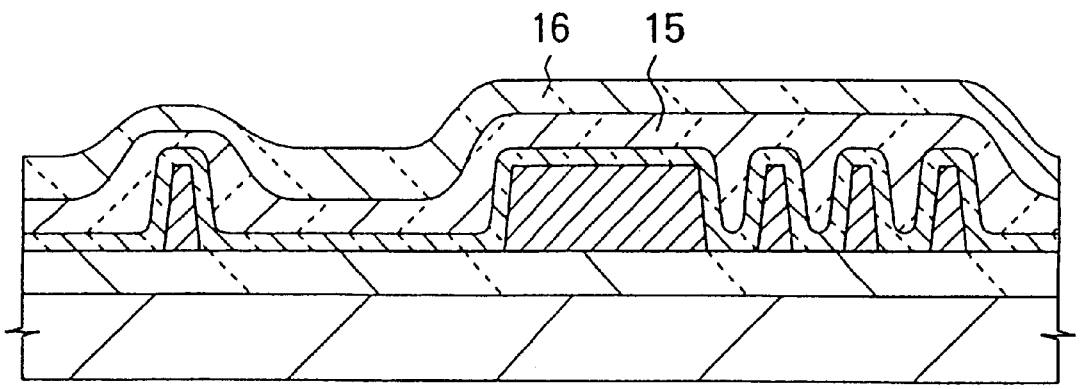

By using a dry etching technique which employs $C_2F_6$ plasma, the spin-on glass film 17 in its entirety and a top portion of the third insulating film 16 are etched back over the entire surface. After the etch-back step, the third insulating film 16 is smoothed or flattened as illustrated in FIG. 7E.

Figure 6:
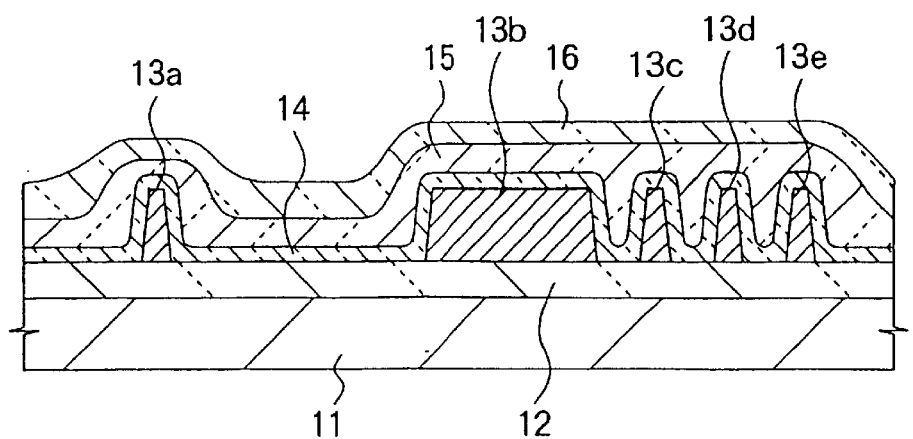
FIG. 6 is a cross-sectional view of another semiconductor device according to a second embodiment of the invention.

Finally, a heat treatment is effected at a temperature of about 400° C. in a nitrogen atmosphere, thereby finishing the interlevel dielectric layer shown in FIG. 6. Subsequently, second layer interconnects and via-holes reaching the first layer interconnects 13a etc. are formed., to obtain a two-layer interconnection structure of a semiconductor device. In the second embodiment, the specified inclination angle of the side-walls of the first layer interconnects 13a etc. has an important role in the forward mesa structure.

Specifically, the effects of the base insulating film 14 formed by a DF-PECVD process according to the invention are especially remarkable when the film thickness thereof is equal to or greater than 25 nm. If the first layer interconnects have vertical side-walls and a small width to provide a large aspect ratio of the interconnect itself as well as the inter-interconnect aspect ratio, it will be difficult to secure the above-mentioned film thickness of the base insulating film 14. After our several experiments, it was confirmed that the base insulating film 4 having a thickness equal to or greater than 25 nm could be formed when the inclination angle of the side-walls of the first layer interconnects was equal to or less than 88°.

In the second embodiment, as described above, the arrangement is such that the inter-interconnect aspect ratio in the first layer interconnects is about 3, the width of the interconnects is 0.25 µm, and the side-walls of the interconnects exhibit a forward mesa structure. In this embodiment, with the specified inclination angle as described above, the interlevel dielectric layer is free from voids and has excellent smoothness, flatness and a filling capability.

It should be noted that in the second embodiment, an additional top insulating film need not be formed, thereby simplifying the process for forming the interlayer insulating film by a corresponding amount.

While a liquid organic silica is used in the second embodiment, a flattening step can be similarly conducted using a spin-on glass film formed by a liquid inorganic silica. If it is sufficient to form via-holes on the first layer interconnects, the spin-on glass film can be left at the spaces between the first layer interconnects without any failure.

In the described embodiments, the base insulating film is formed by a DF-PECVD process. However, it should be understood that a similar result can be achieved by utilizing multiple-frequency components which include more than two frequency components.

Although the present invention is described with reference to preferred embodiments thereof, the present invention is not limited thereto and it will be apparent from those skilled in the art that various modifications or alterations can be easily made from the embodiments without departing from the scope of the present invention as set forth in the appended claims.

What is claimed is:

1. A method for forming a semiconductor device of a multi-layer interconnection structure comprising the steps of forming an insulating film overlying a semiconductor substrate, forming a first interconnect pattern on said insulating film, forming a first silicon oxide film on said first interconnect pattern and said insulating film by a dual-frequency plasma enhanced chemical vapor deposition (CVD) using a higher frequency component and a lower frequency component for plasma discharge and using a alkoxysilane as 2a reactive gas, said first silicon oxide film having a thickness lower than a thickness of said first interconnect pattern, forming a second silicon oxide film by an atmospheric pressure CVD process using a mixture of alkoxysilane and ozone as a reactive gas, forming a third silicon oxide film on said second silicon oxide film by a plasma enhanced CVD process, and forming a second interconnect pattern overlying said second silicon oxide film.

2. A method for manufacturing a semiconductor device of a multi-layer interconnection structure as defined in claim 1, further comprising the steps of forming a spin-on glass film on said third silicon oxide film, and etching back said spin-on glass film and a portion of said third silicon oxide film by a plasma etching process to flatten a remaining portion of said third silicon oxide film.

3. A method for manufacturing a semiconductor device of a multi-layer interconnection structure as defined in claim 1, wherein the thickness of said first silicon oxide is not lower than 25 nm.

4. A method for manufacturing a semiconductor device of a multi-layer interconnection structure as defined in claim 1, wherein said alkoxysilane is tetraethoxysilane (TEOS).

5. A method for manufacturing a semiconductor device of a multi-layer interconnection structure as defined in claim 1, wherein said higher frequency component has a frequency of about 13.56 MHz, and said lower frequency component has a frequency ranging between 200 and 450 kHz and a discharge power density ranging between 0.1 and 0.7 watt/$cm^2$.

6. A method for manufacturing a semiconductor device of a multi-layer interconnection structure as defined in claim 1, said forming of the first interconnect pattern includes patterning of an interconnection film by a dry etching to form a forward mesa structure of the first interconnect pattern.

7. The method for manufacturing a semiconductor device of a multi-layer interconnection structure as defined in claim 2, wherein the second silicon oxide film is formed to be in direct contact with the first silicon oxide film, and the third silicon oxide film is formed to be in direct contact with the second silicon oxide film.

8. The method for manufacturing a semiconductor device of a multi-layer interconnection structure as defined in claim 7, wherein the second silicon oxide film is not subjected to etching prior to formation of the third silicon oxide film.

9. The method for manufacturing a semiconductor device of a multi-layer interconnection structure as defined in claim 8, wherein the etching step is performed to allow a portion of the spin-on glass film to remain on the third silicon oxide film.

* * * * *